(12) United States Patent
Gomez

(10) Patent No.: US 8,165,554 B2
(45) Date of Patent: *Apr. 24, 2012

(54) QUADRATURE CORRECTION METHOD FOR ANALOG TELEVISION RECEPTION USING DIRECT-CONVERSION TUNERS

(76) Inventor: Ramon A. Gomez, San Juan Capistrano, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/222,357

(22) Filed: Aug. 7, 2008

(65) Prior Publication Data

US 2009/0040393 A1 Feb. 12, 2009

Related U.S. Application Data

(63) Continuation of application No. 10/441,057, filed on May 20, 2003, now Pat. No. 7,412,222.

(51) Int. Cl.
*H04B 1/10* (2006.01)
*H04N 5/52* (2006.01)

(52) U.S. Cl. ......... 455/302; 455/324; 455/334; 348/731

(58) Field of Classification Search ............... 455/179.1, 455/226.1, 227, 231, 232.1, 200.1, 296, 304, 455/305, 308, 323, 324, 334, 302; 375/340, 375/345, 346; 348/731, 705
See application file for complete search history.

(56) References Cited

U.S. PATENT DOCUMENTS

| | | | |
|---|---|---|---|
| 4,340,975 A | 7/1982 | Onishi et al. | |
| 4,686,569 A | 8/1987 | Campbell et al. | |
| 4,688,096 A | 8/1987 | Campbell et al. | |
| 4,729,110 A * | 3/1988 | Welles et al. | 702/107 |
| 4,974,086 A | 11/1990 | Ehrhardt | |
| 5,200,826 A | 4/1993 | Seong | |
| 5,249,203 A * | 9/1993 | Loper | 375/344 |
| 5,263,196 A | 11/1993 | Jasper | |
| 5,369,411 A | 11/1994 | Lisle, Jr. | |
| 5,563,916 A * | 10/1996 | Scarpa | 375/345 |
| 5,636,252 A * | 6/1997 | Patel et al. | 375/345 |
| 5,705,949 A * | 1/1998 | Alelyunas et al. | 329/304 |

(Continued)

FOREIGN PATENT DOCUMENTS

EP 0 180 339 A2 5/1986

(Continued)

OTHER PUBLICATIONS

Michaels, J. et al., "Compensation of Frequency Dependent Quadrature Imbalance in a Zero-IF Down Converter", *Motorola Technical Developments*, Motorola Inc., vol. 38, pp. 183-186, Jun. 1999.

(Continued)

*Primary Examiner* — Blane J Jackson
(74) *Attorney, Agent, or Firm* — Sterne, Kessler, Goldstein & Fox P.L.L.C.

(57) ABSTRACT

A direct conversion radio frequency (RF) tuner includes a mixer generating I and Q quadrature components. A phase detection circuit generates a phase error measurement between the I quadrature component and the Q quadrature component. A phase correction circuit corrects a phase of the Q component based on the phase error measurement, and outputs a phase-corrected Q quadrature component. An I quadrature component gain control circuit receives the I quadrature component and outputting an amplitude corrected I quadrature component. A Q quadrature component gain control circuit receives the phase corrected Q quadrature component and outputs an amplitude corrected Q quadrature component.

26 Claims, 4 Drawing Sheets

U.S. PATENT DOCUMENTS

| | | | |
|---|---|---|---|
| 5,737,035 A * | 4/1998 | Rotzoll | 348/725 |
| 5,812,927 A * | 9/1998 | Ben-Efraim et al. | 725/70 |
| 5,847,612 A | 12/1998 | Birleson | |
| 5,930,696 A | 7/1999 | Tzuang et al. | |
| 5,949,821 A * | 9/1999 | Emami et al. | 375/235 |
| 5,999,802 A | 12/1999 | Aschwanden | |
| 6,009,317 A * | 12/1999 | Wynn | 455/296 |
| 6,046,781 A * | 4/2000 | LeRoy | 348/731 |
| 6,052,026 A | 4/2000 | Tiller et al. | |
| 6,118,322 A * | 9/2000 | Bockelman et al. | 327/317 |
| 6,118,495 A * | 9/2000 | Limberg et al. | 348/614 |
| 6,137,999 A | 10/2000 | Lovelace et al. | |
| 6,160,572 A | 12/2000 | Matsuura | |
| 6,163,684 A | 12/2000 | Birleson | |
| 6,175,728 B1 | 1/2001 | Mitama | |
| 6,304,751 B1 | 10/2001 | King | |
| 6,330,290 B1 | 12/2001 | Glas | |
| 6,377,620 B1 * | 4/2002 | Ozluturk et al. | 375/235 |
| 6,445,425 B1 * | 9/2002 | Limberg | 348/731 |
| 6,484,042 B1 | 11/2002 | Loke | |
| 6,560,449 B1 | 5/2003 | Liu | |
| 6,714,776 B1 * | 3/2004 | Birleson | 455/302 |
| 6,785,529 B2 | 8/2004 | Ciccarelli et al. | |
| 6,892,060 B2 | 5/2005 | Zheng | |
| 6,895,045 B2 | 5/2005 | Ozluturk et al. | |
| 6,928,287 B2 * | 8/2005 | Trott et al. | 455/447 |
| 6,940,930 B2 | 9/2005 | Brown et al. | |
| 6,950,480 B2 | 9/2005 | Brown | |
| 7,020,220 B2 | 3/2006 | Hansen | |
| 7,038,733 B2 | 5/2006 | Dent | |
| 7,061,994 B2 | 6/2006 | Li et al. | |
| 7,133,657 B2 | 11/2006 | Kuenen et al. | |
| 7,158,586 B2 | 1/2007 | Husted | |
| 7,295,250 B2 | 11/2007 | Gomez et al. | |
| 7,336,939 B2 | 2/2008 | Gomez | |
| 7,376,170 B2 | 5/2008 | Scheck | |
| 7,412,222 B2 * | 8/2008 | Gomez | 455/324 |
| 2002/0007574 A1 | 1/2002 | Williams | |
| 2002/0097812 A1 | 7/2002 | Wiss | |
| 2002/0177425 A1 * | 11/2002 | Li | 455/296 |
| 2003/0003891 A1 | 1/2003 | Kivekas et al. | |
| 2004/0002323 A1 * | 1/2004 | Zheng | 455/324 |
| 2004/0005022 A1 * | 1/2004 | Zhu et al. | 375/365 |
| 2004/0029537 A1 * | 2/2004 | Pugel et al. | 455/115.1 |

FOREIGN PATENT DOCUMENTS

| | | |
|---|---|---|
| EP | 0 719 013 A2 | 6/1996 |
| EP | 0 840 484 A2 | 5/1998 |
| EP | 0 863 606 A1 | 9/1998 |
| EP | 0 948 128 A1 | 10/1999 |
| EP | 0 964 557 A1 | 12/1999 |
| EP | 1 063 767 A2 | 12/2000 |
| EP | 1 172 928 A2 | 1/2002 |
| WO | WO 98/32221 | 7/1998 |
| WO | WO 01/15317 A1 | 3/2001 |
| WO | WO 01/24358 A1 | 4/2001 |

OTHER PUBLICATIONS

Aschwanden, F., "Direct Conversion—How to Make it Work in TV Tuners", *IEEE Transactions on Consumer Electronics*, vol. 42, No. 3, pp. 729-738, Aug. 1996.

Suzuki, H. and Yoshino, H., "Affine Transformations for Compensating Linear Distortion: An Application to Linear Signaling in Mobile Radio", *Electronics and Communication in Japan*, Part I, vol. 75, No. 11, pp. 47-58, (Translated from Denshi Joho Tsushin Gakkai Ronbunshi, vol. 75-B-II, No. 1, pp. 1-9, Jan. 1992.

Search Report for European Patent Application No. EP 04 01 1413, dated Aug. 13, 2004.

* cited by examiner

QUADRATURE CORRECTION METHOD FOR ANALOG TELEVISION RECEPTION USING DIRECT-CONVERSION TUNERS

CROSS REFERENCE TO RELATED APPLICATIONS

This application is a continuation of U.S. patent application Ser. No. 10/441,057, filed on May 20, 2003, now U.S. Pat. No. 7,412,222, titled "Quadrature Correction Method for Analog Television Reception Using Direct-Conversion Tuners", which is incorporated herein by reference in its entirety.

BACKGROUND OF THE INVENTION

1. Field of the Invention

The present invention relates to RF receivers, and more particularly, to direct conversion television tuners and receivers.

2. Description of the Related Art

Direct-conversion, or homodyne, receivers are today popular for many communications applications because of their simplicity and low power. They do not require intermediate-frequency (IF) filters, which are often costly, and need only one frequency conversion stage and one local oscillator (LO). Direct-conversion receivers rely entirely on quadrature mixing to obtain the necessary image rejection. The conversion gain and phase of the quadrature mixing stages must be precisely matched to obtain good image rejection.

At the frequencies used for direct broadcast satellite (DBS) transmissions (approximately 1-2 GHz), 40 dB of image rejection is about the maximum level of image rejection that can be achieved solely through component matching in practical integrated circuits.

This is adequate for the quadrature phase shift keying (QPSK) and 8-ary phase shift keying (8PSK) modulation formats used in these systems. However, analog television requires signal-to-noise ratios of about 50 dB for ideal image quality. As there are many contributors to the noise budget in realistic communication systems, the noise contribution from images must be on the order of 60 dB below the signal or better.

FIG. 1 shows a conventional direct conversion analog television tuner. As shown in FIG. 1, RF input is received by a low-noise amplifier 101. The RF input is then fed into mixers 102a, 102b. Phase-lock loop (PLL) 105 outputs a waveform at a specified frequency to the mixer 102a, and, through a 90-degree phase shifter 104, to the mixer 102b. Collectively, the mixers 102a, 102b, the PLL 105 and the phase shifter 104 may be referred to as a mixing stage 125.

The outputs of the mixing stage 105 are fed to low-pass filters 106a, 106b, and then to variable gain amplifiers 108a, 108b. The variable gain amplifiers 108a, 108b are in a closed loop that includes power detection circuits 109a, 109b, respectively. The outputs of the amplifiers 108a, 108b are the quadrature components I and Q, respectively.

The analog television spectrum contains a discrete tone at the picture carrier. This picture carrier will appear in the I and Q signals at the same frequency. Ideally, the I and Q picture carriers will be equal in amplitude and 90 degrees apart in phase. However, because of circuit imperfections, the I and Q picture carriers will have slightly different amplitudes and be somewhat more or less than 90 degrees apart. This is illustrated in the spectrums of FIG. 2.

As may be seen in FIG. 2, the I and the Q components are unbalanced. In this case, the amplitude of the Q component is larger than the amplitude of the I component by $\delta$, and is out of phase with the I component by $\phi$.

SUMMARY OF THE INVENTION

The present invention is directed to a quadrature correction method for analog television reception using direct-conversion tuners that substantially obviates one or more of the problems and disadvantages of the related art.

There is provided a direct conversion radio frequency (RF) tuner including a mixer generating I and Q quadrature components. A phase detection circuit generates a phase error measurement between the I quadrature component and the Q quadrature component. A phase correction circuit corrects a phase of the Q component based on the phase error measurement, and outputs a phase-corrected Q quadrature component. An I quadrature component gain control circuit receives the I quadrature component and outputting an amplitude corrected I quadrature component. A Q quadrature component gain control circuit receives the phase corrected Q quadrature component and outputs an amplitude corrected Q quadrature component.

In another aspect there is provided a method of balancing I and Q quadrature components including the steps of, during a horizontal sync signal (or during a vertical sync, or any other feature of the television signal where the amplitude and phase are known and constant), adjusting amplitude of the I quadrature component to a predetermined level using an automatic gain control circuit to generate a normalized I quadrature component; during the horizontal sync, generating a phase error of the normalized I quadrature component and the Q quadrature component; subtracting a product of the phase error and the I quadrature component from the Q quadrature component; and during the horizontal sync, adjusting an amplitude of the Q quadrature component to the amplitude of the normalized I quadrature component.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGS.

The accompanying drawings, which are included to provide a further understanding of the exemplary embodiments of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the embodiments of the present invention, examples of which are illustrated in the accompanying drawings.

This invention includes an algorithm and integrated circuit implementation for automatically maintaining image rejection adequate for analog television reception with a direct-conversion tuner.

Conventional techniques have either been (1) applied to digital modulation formats with known constellations (2) or used test tones generated in the receiver. The present approach does not require a test tone generator, and provides a specific algorithm applicable to analog television signals.

Figure 1:
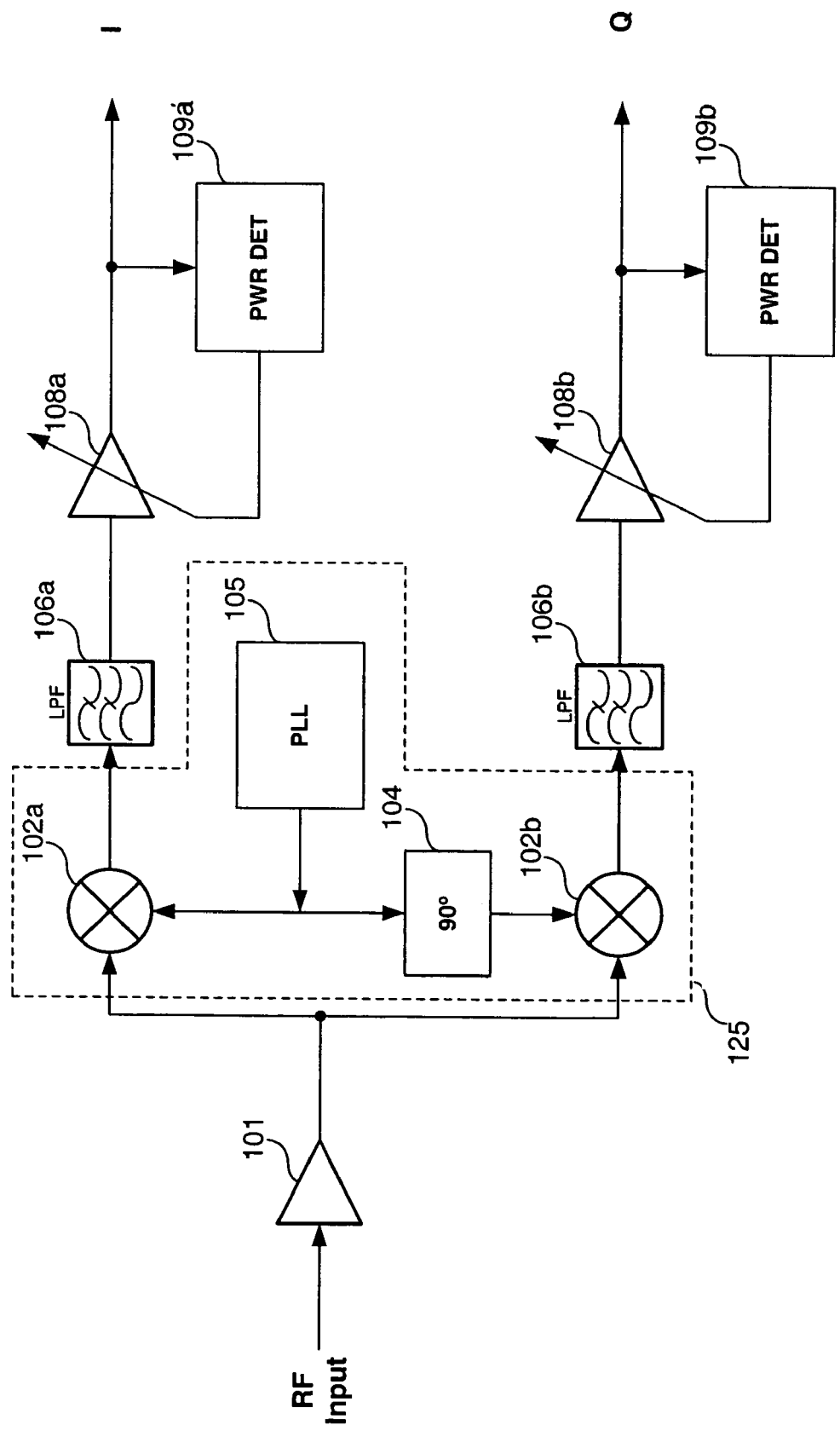
FIG. 1 shows a conventional conversion tuner that generates the I and Q quadrature components.
Figure 2:
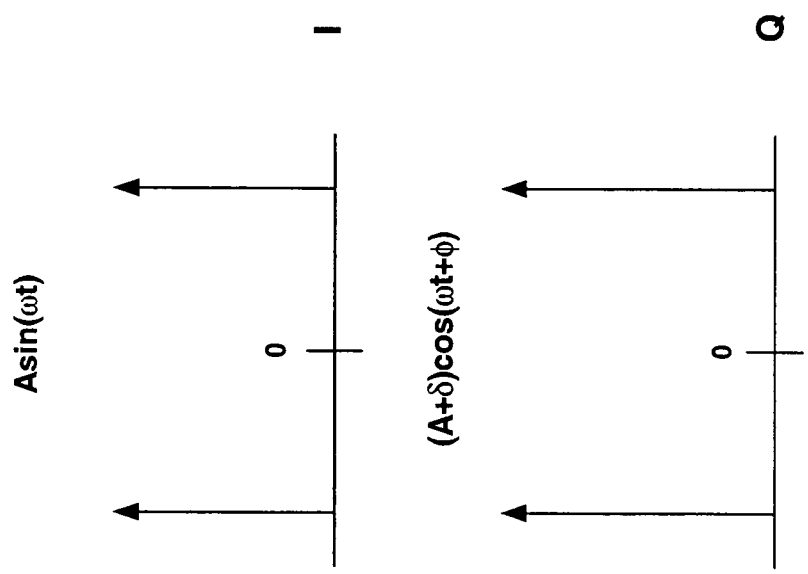
FIG. 2 shows an example of unbalanced I and Q components.
Figure 3:
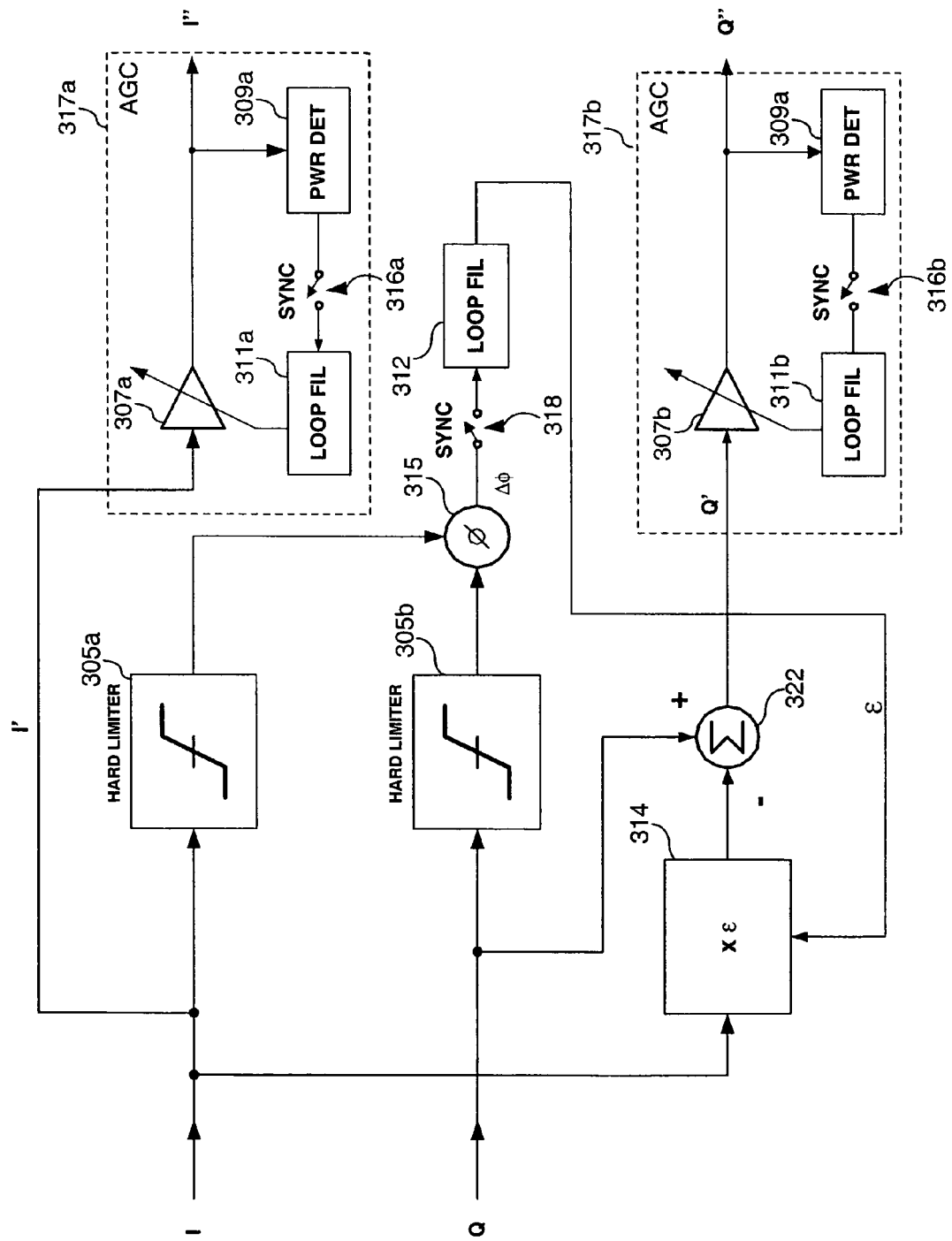
FIG. 3 shows a tuner of the present invention.

FIG. 3 illustrates a circuit that may be used to correct quadrature component imbalance. As shown in FIG. 3, the quadrature components I and Q are input into two hard limiters 305a and 305b, respectively. A limiter is a circuit that, for every time the value of the input is greater than zero, outputs a one, and for every time the output is less than zero, outputs a minus-one. The outputs of the hard limiters 305a, 305b are input into a phase difference detection circuit 315. The phase detection circuit outputs a zero when the phase difference between its inputs is exactly 90 degrees, and a $\Delta\phi$, which is a measure of the phase error. The $\Delta\phi$ is then fed through a synchronization switch 318, and a loop filter 312, to a multiplier 314. The multiplier 314 multiplies the I component and the phase error $\gamma$, and outputs them to a summer 322, as shown in the figure. The second input to the summer 322 is the Q component. The output of the summer 322, Q', is fed to an automatic gain control stage 317b. The AGC stage 317b includes a variable gain amplifier 307b, a power detection circuit 309b, a synchronization switch 316b, and a loop filter 311b, which are connected in a feedback mechanism, as shown in the figure. The output of the AGC circuit 317b is Q", which has a corrected phase and amplitude relative to I". This may be referred to as using a phase correction circuit.

As further shown in FIG. 3, the quadrature component I (which in this case is the same as the quadrature component I') is inputted to an automatic gain control stage 317a, which, similar to the AGC stage 317b, includes a variable gain amplifier 307a, a power detection circuit 309a, a synchronization switch 316a, and a loop filter 311a, which are connected in a feedback loop. Note that the synchronization switch 316a is closed during the horizontal sync, and open at all other times. The output of the AGC circuit 317a is the amplitude- and phase-corrected quadrature component I". Note that in this circuit, the I and the Q components are amplitude-adjusted relative to an external reference, or a calibration voltage source, although they may also be adjusted relative to each other, i.e., the I quadrature component may be used as a reference for the Q quadrature component, or the components may be adjusted relative to the picture carrier in the signal. The circuit may be digitally controlled, as required, or may be analog controlled.

The correction algorithm is as follows. (The assumption is made that the horizontal sync signal has been extracted.)

Figure 4:
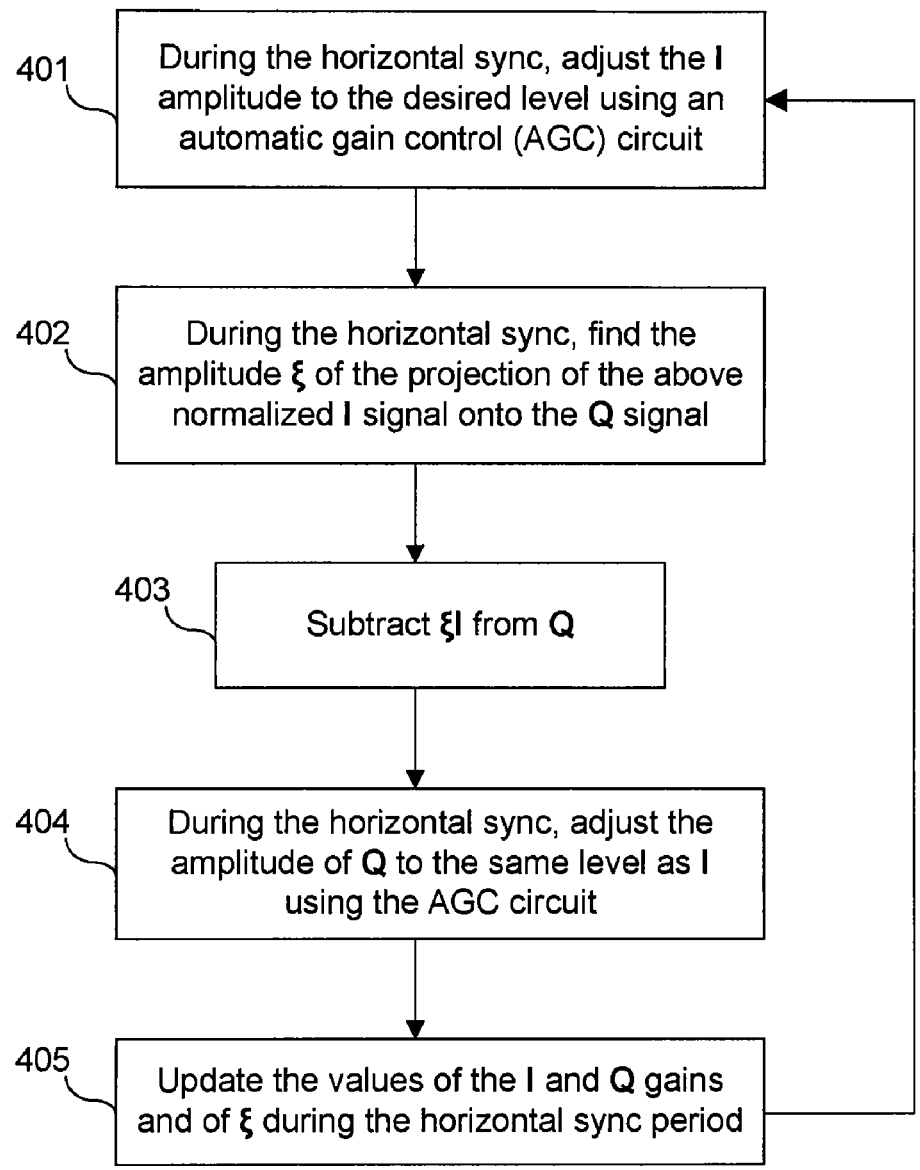
FIG. 4 shows a flow chart of a correction algorithm according to the present invention.

1. During the horizontal sync, adjust the I amplitude to the desired level using an automatic gain control (AGC) circuit 317a and the closing synchronization switch 316a (see FIG. 4, step 401).
2. During the horizontal sync, find the amplitude $\gamma$ of the projection of the above normalized I signal onto the Q signal (see FIG. 4, step 402).
3. Subtract $\gamma$I from Q (see FIG. 4, step 403).
4. During the horizontal sync, adjust the amplitude of Q to the same level as I using the automatic gain control circuit 317b (see FIG. 4, step 404).
5. Except during the horizontal sync period, the values of the I and Q gains and of $\gamma$ do not need to be updated (see FIG. 4, step 405).

A block diagram of a circuit, that implements this algorithm continuously is shown in FIG. 3.

As shown in FIG. 3, a projection of I is subtracted with some gain $\gamma$ from Q to form Q'. A phase detector 315, whose output is proportional to the phase difference between I and Q and equal to zero when the phase difference is equal to 90 degrees, updates the coefficient $\gamma$. If the feedback polarity is correct, and the loop gain very high, this circuit will maintain very accurate quadrature. Note that it is much easier to detect quadrature at a baseband frequency of a few megahertz than to maintain quadrature balance in two RF mixers which must operate up to 860 MHz (the upper limit of the television band). The time delay corresponding to a given phase error is more than one hundred times less in the baseband case.

I and Q' are then leveled by AGC circuits 317a, 317b to produce I" and Q", which are the balanced outputs. These can now be processed in the conventional way to obtain a baseband analog signal with adequate image rejection.

Because the amplitude and phase imbalances in the quadrature mixer circuitry 125 change only very slowly over time, these feedback loops can have very narrow bandwidths and thereby can be very accurate.

All of the above processing can be done digitally, after the I and Q signals are digitized. Therefore, only the performance of the analog to digital converters (ADCs) and the resolution of the digital computations limit the accuracy of the algorithm.

Compared to conventional techniques for closed-loop quadrature correction in direct-conversion receivers, this technique relies on observations of the converted I and Q signals directly, and eliminates many sources of error associated with indirect measurements of quadrature balance. It can also be implemented as a simple analog or digital algorithm in the baseband processor of a TV viewer, without modifying the RF circuitry.

It will be understood by one of ordinary skill in the art that while the above discussion is primarily in terms of the horizontal sync signal, the invention would work equally well by using a vertical sync, or any other feature of the television signal where the amplitude and phase are known and constant. Additionally, the constant portion of the input signal may be an equalizing pulse, a data field sync signal, or a data segment sync signal.

Furthermore, the circuit can be tuned to operate on the picture carrier signal, which is present in standard analog TV signals. In other words, the I-Q correction described above can be performed on the picture carrier, and the rest of the I-Q components in the TV spectrum will be corrected as well. By updating the I-Q quadrature components only during the horizontal sync, rapid convergence of the algorithm described above may be achieved.

CONCLUSION

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks and method steps illustrating the performance of specified functions and relationships thereof. The boundaries of these functional building blocks and method steps have been arbitrarily defined herein for the convenience of the description. Alternate boundaries can be defined so long as the specified functions and relationships thereof are appropriately performed. Also, the order of method steps may be rearranged. Any such alternate boundaries are thus within the scope and spirit of the claimed invention. One skilled in the art will recognize that these functional building blocks can be implemented by discrete components, application specific integrated circuits, processors executing appropriate software and the like or any combination thereof. Thus, the breadth and scope of the present invention should not be limited by any of the above-described exemplary embodiments, but should be defined only in accordance with the following claims and their equivalents.

What is claimed is:

1. A direct-conversion radio-frequency tuner for processing a television (TV) input signal received at an input of the tuner, the TV input signal having a horizontal sync portion, comprising:
    a mixer configured to generate a first quadrature component from the input signal; and
    a gain control circuit configured to receive the first quadrature component and output an amplified first quadrature component,
    wherein a gain of the gain control circuit is determined based on the horizontal sync portion of the TV input signal.

2. The tuner of claim 1, wherein the gain control circuit comprises:
    a variable gain amplifier;
    a loop filter coupled to the variable gain amplifier; and
    a power detection circuit coupled between the variable gain amplifier and the loop filter; and
    a switch coupled between the power detection circuit and the loop filter, the switch responsive to the horizontal sync portion of the TV input signal.

3. The tuner of claim 1, wherein the gain control circuit is configured to generate the amplified first quadrature component corrected relative to a reference voltage.

4. The tuner of claim 1, wherein a constant portion of the TV input signal is a phase of the horizontal sync portion.

5. The tuner of claim 1, wherein a constant portion of the TV input signal is an amplitude of the horizontal sync portion.

6. The tuner of claim 1, wherein the mixer is further configured to generate a second quadrature component.

7. The tuner of claim 6, further comprising:
    a phase correction circuit configured to generate a phase error measurement between the first quadrature component and the second quadrature component, adjust a phase of the first component based on the phase error measurement, and output a phase-corrected first quadrature component.

8. The tuner of claim 7, wherein the phase correction circuit comprises:
    a first hard limiter configured to receive the first quadrature component and output a modified first quadrature component;
    a second hard limiter configured to receive the second quadrature component and output a modified second quadrature component;
    a phase detection circuit configured to receive the modified first quadrature component and the modified second quadrature component and output an error signal;
    a loop filter configured to filter the error signal;
    a circuit configured to generate a product of the error signal and the second quadrature component; and
    a summer configured to receive the first quadrature component, the product of the error signal, and the second quadrature component and further configured to output a phase-corrected first quadrature component.

9. The tuner of claim 6, further comprising:
    a second gain control circuit configured to receive the second quadrature component and output an amplitude-corrected second quadrature component.

10. The tuner of claim 9, wherein a gain of the second gain control circuit is determined during the horizontal sync portion of the TV input signal.

11. The tuner of claim 9, wherein the second gain control circuit comprises:
    a variable gain amplifier configured to receive the second quadrature component and output an amplitude-corrected second quadrature component;
    a loop filter coupled to the variable gain amplifier; and
    a power detection circuit coupled between an output of the variable gain amplifier and the loop filter.

12. The tuner of claim 9, wherein the second gain control circuit is configured to output the amplitude-corrected second quadrature component adjusted relative to a reference voltage.

13. The tuner of claim 9, wherein the second gain control circuit is configured to output the amplitude-corrected second quadrature component adjusted relative to the first quadrature component.

14. The tuner of claim 1, wherein the first quadrature component is an I quadrature component.

15. The tuner of claim 1 wherein the first quadrature component is a Q quadrature component.

16. The tuner of claim 1, wherein the gain control circuit includes:
    an amplifier that receives the first quadrature component; and
    a feedback loop that controls a gain of the amplifier based on an output of the amplifier; the feedback loop including a switch that is closed during the horizontal sync portion of the TV input signal.

17. A direct-conversion radio-frequency tuner for processing a television (TV) input signal received at an input of the tuner, the TV input signal having a vertical sync portion, comprising:
    a mixer configured to generate a first quadrature component from the input signal; and
    a gain control circuit configured to receive the first quadrature component and output an amplified first quadrature component,
    wherein a gain of the gain control circuit is determined based on the vertical sync portion of the TV input signal.

18. The tuner of claim 17, wherein the gain control circuit includes:
    an amplifier that receives the first quadrature component; and
    a feedback loop that controls a gain of the amplifier based on an output of the amplifier, the feedback loop including a switch that is closed during the vertical sync portion of the TV input signal.

19. A method of balancing first and second quadrature components generated from a television (TV) input signal received at an input of the tuner, the TV input signal having a horizontal sync portion, comprising:

adjusting an amplitude of the second quadrature component to a predetermined level using an automatic gain control circuit to generate a normalized second quadrature component;

generating a phase error of the normalized second quadrature component and the first quadrature component;

subtracting a product of the phase error and the second quadrature component from the first quadrature component; and adjusting an amplitude of the first quadrature component to an amplitude of the normalized second quadrature component;

wherein at least one of the adjusting the amplitude of the second quadrature component, the generating a phase error, and the adjusting the amplitude of the first quadrature component occurs during the horizontal sync portion of the TV input signal.

20. The method of claim 19, wherein the first quadrature component is an I quadrature component and the second quadrature component is a Q quadrature component.

21. The method of claim 19, wherein the first quadrature component is a Q quadrature component and the second quadrature component is an I quadrature component.

22. A method of adjusting an amplitude of a quadrature component, comprising:

generating the quadrature component from a television (TV) input signal received at an input of the tuner, the TV input signal having a vertical sync portion; and adjusting the amplitude of the quadrature component to a predetermined level using an automatic gain control circuit during the vertical sync portion of the TV input signal.

23. The method of claim 22, further including:
detecting a phase of the vertical sync portion as a known and constant portion of the TV input signal.

24. The method of claim 22, further including:
detecting an amplitude of the vertical sync portion as a known and constant portion of the TV input signal.

25. The method claim 22, wherein the quadrature component is an I quadrature component.

26. The method of claim 22, wherein the quadrature component is a Q quadrature component.

* * * * *

UNITED STATES PATENT AND TRADEMARK OFFICE
CERTIFICATE OF CORRECTION

PATENT NO. : 8,165,554 B2  
APPLICATION NO. : 12/222357  
DATED : April 24, 2012  
INVENTOR(S) : Ramon A. Gomez Page 1 of 1

It is certified that error appears in the above-identified patent and that said Letters Patent is hereby corrected as shown below:

On the Title Page, insert --(73) Assignee: Broadcom Corporation, Irvine, CA (US)--.

Signed and Sealed this  
Third Day of July, 2012

David J. Kappos  
*Director of the United States Patent and Trademark Office*